United States Patent [19]
Warwar

[11] Patent Number: 6,034,570
[45] Date of Patent: Mar. 7, 2000

[54] GALLIUM ARSENIDE VOLTAGE-CONTROLLED OSCILLATOR AND OSCILLATOR DELAY CELL

[75] Inventor: Greg Warwar, Ventura, Calif.

[73] Assignee: Vitesse Semiconductor Corporation, Camarillo, Calif.

[21] Appl. No.: 09/231,101

[22] Filed: Jan. 14, 1999

Related U.S. Application Data

[62] Division of application No. 08/883,135, Jun. 27, 1997, abandoned.

[51] Int. Cl.$^7$ ................ H03B 5/24; H03L 7/099
[52] U.S. Cl. ................ 331/57; 331/34; 331/175; 331/177 R; 327/280; 327/281
[58] Field of Search ................ 331/34, 57, 175, 331/177 R; 327/156–159, 280, 281

[56] References Cited

U.S. PATENT DOCUMENTS

| | | | |
|---|---|---|---|
| 5,359,301 | 10/1994 | Candage | 331/57 |
| 5,461,335 | 10/1995 | Tsuchiya | 327/280 |

FOREIGN PATENT DOCUMENTS

| | | | |
|---|---|---|---|
| 1175407 | 7/1989 | Japan | 327/281 |
| 403068210 | 3/1991 | Japan | 327/280 |

*Primary Examiner*—David Mis
*Attorney, Agent, or Firm*—Christie, Parker & Hale, LLP

[57] ABSTRACT

A single-gate SCFL delay cell is disclosed for implementation in a common ring oscillator VCO. The delay cell has a differential input stage the output current from which is fixed by two resistors. The differential input stage drives a source follower output stage providing an output capable of driving the differential input of the next stage of the oscillator. The current sources typically used in the source follower output stage have been replaced by voltage-to-current converters. The voltage-to-current converters are comprised of two MESFET devices the gates of which are coupled to a differential control voltage. The source of each of the two devices is coupled to a current source the value of the two current sources being equal. The resistor couples the two sources together such that the voltage drop across the resistor governs how much current is conducted by each of the two devices. The drain of one of the devices is coupled to the supply while the drain of the other device is coupled to the source of the source follower output stage. Thus, the output current of the source follower will be dictated by the difference between the voltage drop across the resistor.

12 Claims, 6 Drawing Sheets

GALLIUM ARSENIDE VOLTAGE-CONTROLLED OSCILLATOR AND OSCILLATOR DELAY CELL

This application is a divisional of 08/883,135 filed Jun. 27, 1997, abandoned.

The present application claims the benefit of the filing date of U.S. application Ser. No. 08/883,135, now abandoned, filed on Jun. 27, 1997.

BACKGROUND OF THE INVENTION

1. FIELD OF THE INVENTION

The present invention relates to voltage-controlled oscillators, and more particularly to a gallium arsenide delay cell for a voltage-controlled ring oscillator, the propagation delay of which is controlled using a differential voltage-to-current converter.

2. ART BACKGROUND

In computer and other digital systems, it is often necessary to generate an internal clock signal the frequency of which is a multiple of the frequency of some externally available reference clock. A common manner of generating such an internal clock is to use a voltage-controlled ring oscillator, which is designed to oscillate at approximately the desired multiple of the frequency of the reference clock. The voltage controlled oscillator is then employed within a phase-locked loop circuit (PLL) to align the phase of the internally generated clock with the reference clock.

FIG. 1 illustrates a typical PLL block diagram. Voltage-controlled oscillator 14 is designed to generate a periodic signal 19 having a frequency range which includes the desired multiple of the frequency of a reference signal 15. A frequency divider 16 divides the generated signal 19 by the desired multiple to obtain a signal 13 having a frequency within some range of the frequency of the reference signal 15. A phase detector 10 senses any difference between the reference signal 15 and the divided signal 13 and provides an error voltage ($V_e$) 11 which is directly proportional to the detected phase difference. This error voltage is then filtered by high-pass filter 12 to eliminate the D.C. component from $V_e$, which serves to slow down the error voltage response. The filtered voltage becomes a control voltage $V_c$ 18 which is coupled to a control tap of the voltage-controlled oscillator (VCO) 14. The control $V_c$ 18 adjusts the frequency of oscillation to bring the phase of the generated signal 19 into phase alignment with that of the reference signal 15. The exact frequency of the VCO 14 depends, preferably linearly, on $V_c$ 18. The feedback eventually drives $V_e$ to zero.

The VCO 14 is typically implemented as a ring oscillator as illustrated in FIG. 2. The delay through each stage 20 is varied by the common control voltage $V_c$ 18. The delay through each stage 20 is D, which equals $D_o + k \cdot V_c$. The phase shift around the oscillator must be 180° at DC. When the ring oscillator is operating, the phase shift around the ring will be 360°. Thus, there will be an additional phase shift of 180° due to the delay of each stage. For a ring oscillator implemented as shown in FIG. 1, the delay through each stage will therefore be equivalent to 45° of phase shift. The frequency of oscillation of the ring oscillator of FIG. 2 can be calculated as $F=1/(2 \times N \times D)$, where N is the number of stages 20, and D is the delay of each stage. If $F_o$ is defined as the frequency of the oscillator when there is zero control voltage, it can be expressed as $1/(2 \times N \times D_o)$. The frequency of the oscillator can then be defined as $F_o/(1+k \cdot V_c/D_o)$ which is approximately equal to $F_o(1-k \cdot V_c/D_o)$. Thus, the frequency of the voltage-controlled oscillator will vary linearly with the control voltage $V_c$, provided that the delay of each stage varies linearly with the control voltage.

For integrated circuit implementations of PLLs, it is often desirable for the control voltage of the VCO to be a fully differential signal, such that its common-mode value is ignored with respect to its differential value. A standard implementation for a delay stage suitable for implementing a ring oscillator type VCO is shown in FIG. 3. This delay stage consists of at least three source-coupled field-effect transistor (FET) logic (SCFL) cells. The cell operates by providing two paths by which a signal may propagate from differential input A to differential output Y, depending upon the value of the differential select input S. The minimum delay occurs when path A1 is fully selected by multiplexer 32, while the maximum delay occurs when path A0 is fully selected by multiplexer 32. Multiplexer 32 is designed to proportionally add the slow path A0 with the fast path A1 by permitting the select input S to vary continuously between a minimum and maximum value. Thus, the control voltage $V_c$ for this type of delay stage is the select input S. The range of the delay is set by the difference in delay between the slow and fast paths.

There are a number of disadvantages to the delay cell of FIG. 3. One is that multiplexer 32 is not able to proportionally add the slow delay to the fast delay in a completely linear manner. This is primarily due to the fact that the gain from the select signal S to the output Y is high near the transition point where the differential value S is 0, but decreases (i.e., saturates) as the select S approaches a differential voltage which selects only one path or the other. The result of this non-linear variation in delay with respect to control voltage is a non-linear variation in output frequency of the VCO versus control voltage. A second drawback of this cell is the presence of two separate signal paths (i.e., A0 or A1) through each delay stage 20 of a ring oscillator implemented using this delay cell, which leads to multiple signal paths around the ring oscillator. This in turn can lead to multiple modes of oscillation existing at the same time. A third drawback is that each delay stage requires at least three SCFL logic gates, which uses great chip area than a single gate delay cell.

FIG. 4 illustrates a simpler single-gate delay cell which can be implemented in technologies such as CMOS, which has the advantage of easy p-channel device fabrication. P-channel device 30 and n-channel device 32 are coupled to a control voltage which vary the resistance of those devices such that they can increase or decrease the time necessary for a signal on input 36 to reach output 34. The problem with this delay cell is that it is not implementable in gallium arsenide (GaAs) semiconductor technology. GaAs semiconductor technology does not readily permit fabrication of p-channel devices.

FIG. 5 illustrates a single-gate SCFL delay cell which provides the benefit of differential signals, but which also relies on the use of p-channel pull-up devices 50 to vary the propagation delay through the cell. The delay will be proportional to the resistance value of the p-channel and the capacitance of the gate of source follower devices 52. Thus, this would also not be a viable solution for implementation in a GaAs fabrication technology.

Thus, there is a need for a delay cell, preferably one that is inherently linear, is a single gate and provides differential signals, for implementation in GaAs semiconductor technology.

SUMMARY OF THE INVENTION

It is therefore an objective of the present invention to provide a VCO delay cell which can be manufactured in GaAs semiconductor technology. It is a further objective of the invention to provide a delay cell which requires a single logic gate. It is still further an objective of the invention to provide a delay cell which provides a delay that is linearly proportional to control voltage. It is still further an objective of the present invention to provide a delay cell the range of delay for which can be adjusted by the value of the resistor in the voltage-to-current converter.

The method and apparatus of the present invention provide a single-gate SCFL delay cell which can be implemented in common ring oscillator VCOs. The delay cell has a differential input stage the output current of which is fixed by two resistors. The differential input stage in turn drives a source follower output stage which provides a differential output capable of driving the differential input of the next stage in the ring oscillator. The current sources typically used to define the output current of the source follower output stage are replaced with voltage-to-current converters.

The voltage-to-current converter consists of two MESFET devices, the gates of which are coupled to a differential control voltage. The source of each of the two devices is coupled to a current source the value of the two current sources being equal. The resistor couples the two sources together such that the voltage drop across the resistor governs how much current is conducted by each of the two devices. The drain of one of the devices is coupled to the supply while the drain of the other device is coupled to the source of the source follower output stage. Thus, the output current of the source follower will be dictated by the difference between the voltage drop across the resistor.

When there is no voltage drop across the resistor (i.e., zero differential control voltage), the output of the source follower will equal the current of the current source of the voltage-to-current converter. Otherwise, the output current will be equal to the value of the current source plus the differential control voltage divided by the value of the resistor. As a result, the output current is linearly related to the control voltage. Moreover, the range of the delay will be governed by the value of the resistor. The greater the output current, the smaller the delay due to the input impedance of the next stage. Of course, the smaller the output current, the longer the delay.

BRIEF DESCRIPTION OF THE DRAWINGS

FIG. 6b illustrates a differential voltage-to-current converter used to implement the delay cell of FIG. 6a.

FIG. 7 illustrates the delay cell of the present invention with the voltage-to-current circuit having been substituted for the source follower current sources of FIG. 6a.

DETAILED DESCRIPTION OF THE INVENTION

Figure 1:
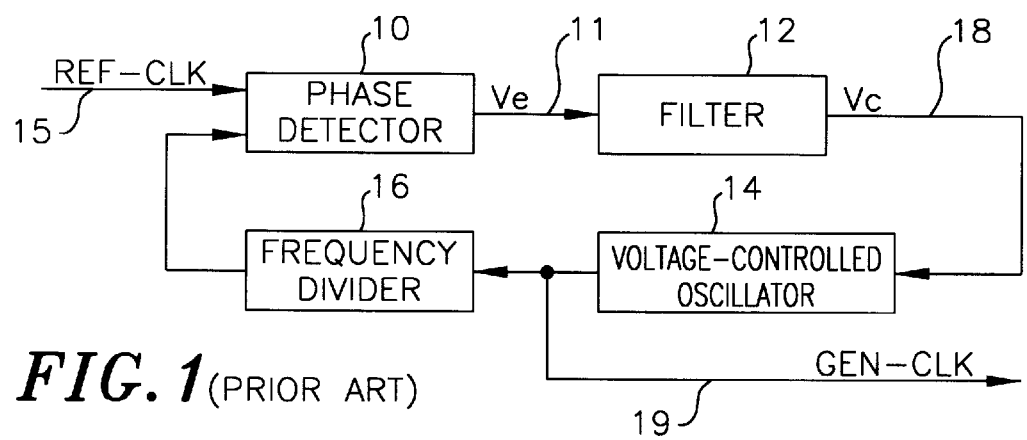
FIG. 1 (prior art) is a block diagram representation of a typical phase-lock loop (PLL).
Figure 2:
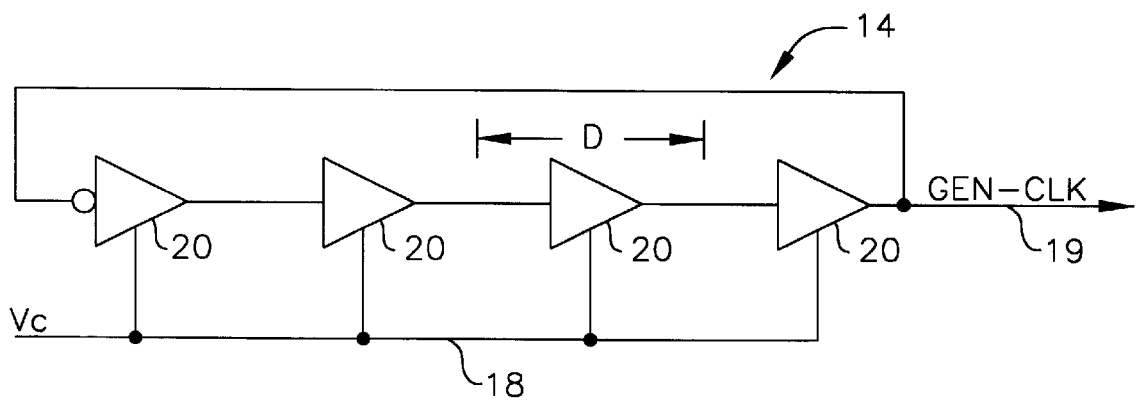
FIG. 2 (prior art) illustrates a typical four-stage ring oscillator.
Figure 3:
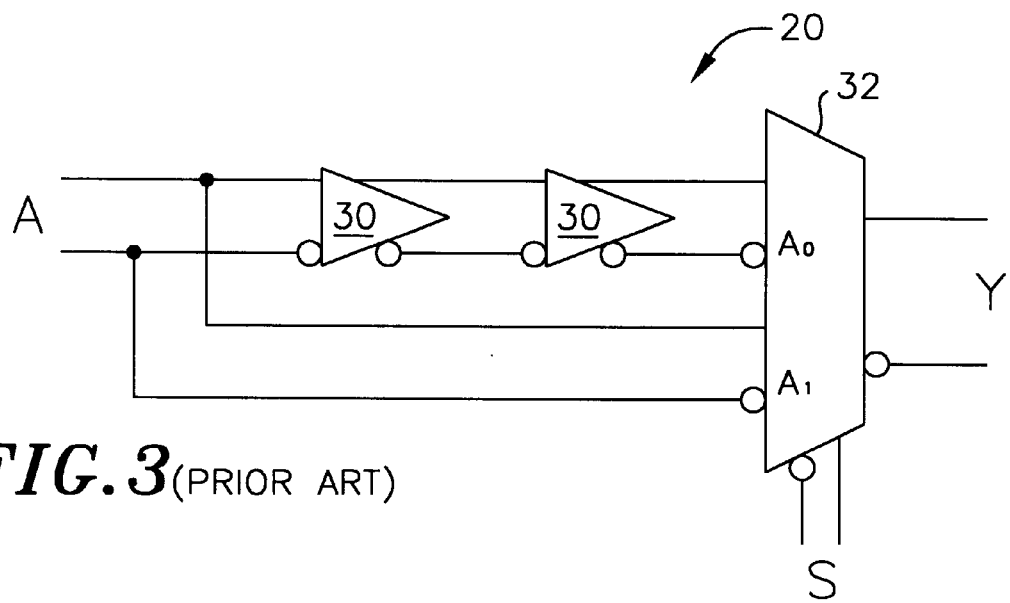
FIG. 3 illustrates a prior art delay cell design for implementing the ring oscillator of FIG. 2.
Figure 4:
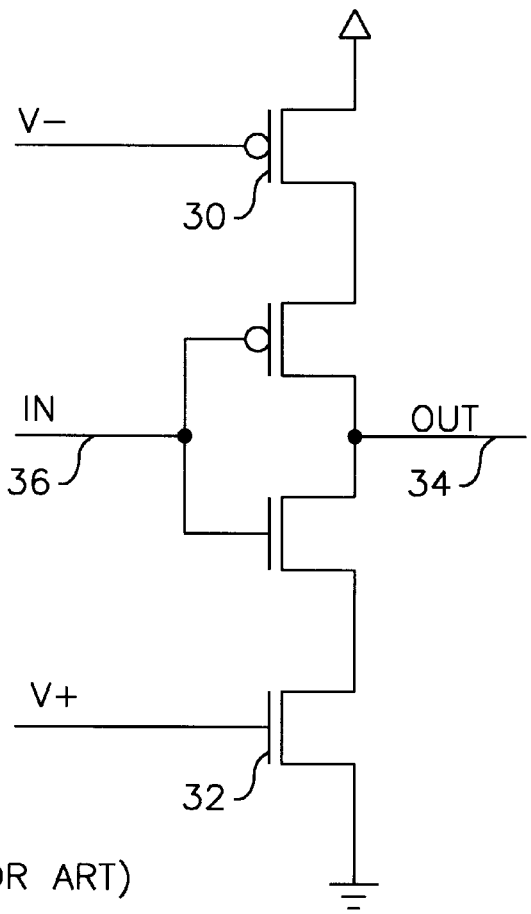
FIG. 4 illustrates a known single gate delay cell which can be implemented in CMOS technology.
Figure 5:
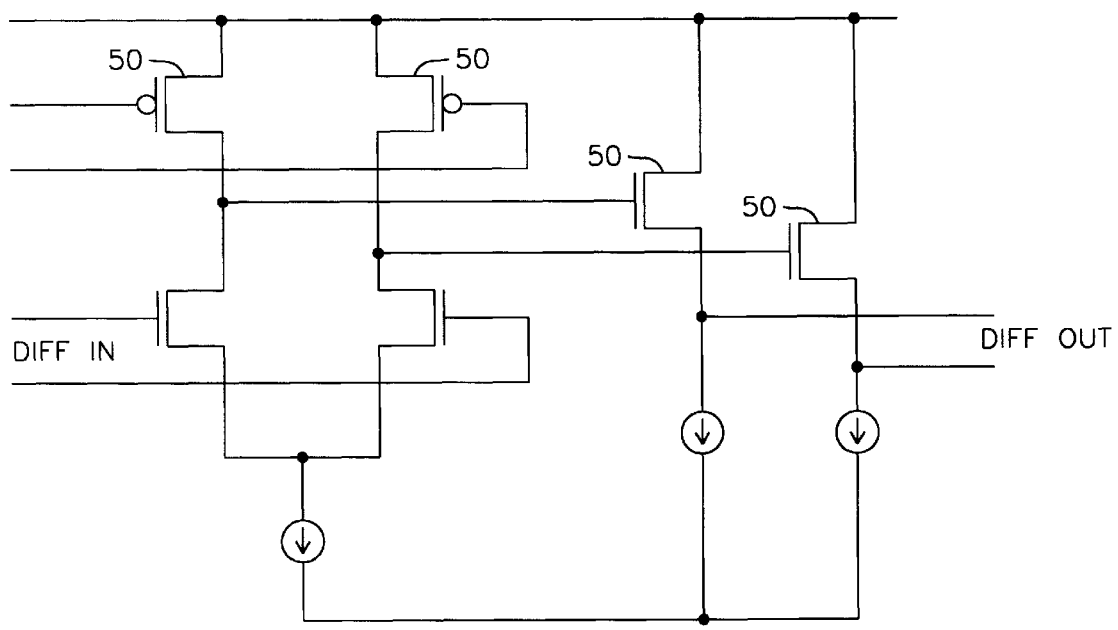
FIG. 5 illustrates a known SCFL single gate delay cell providing for differential signals which can be manufactured in CMOS technology.
Figure 6A:
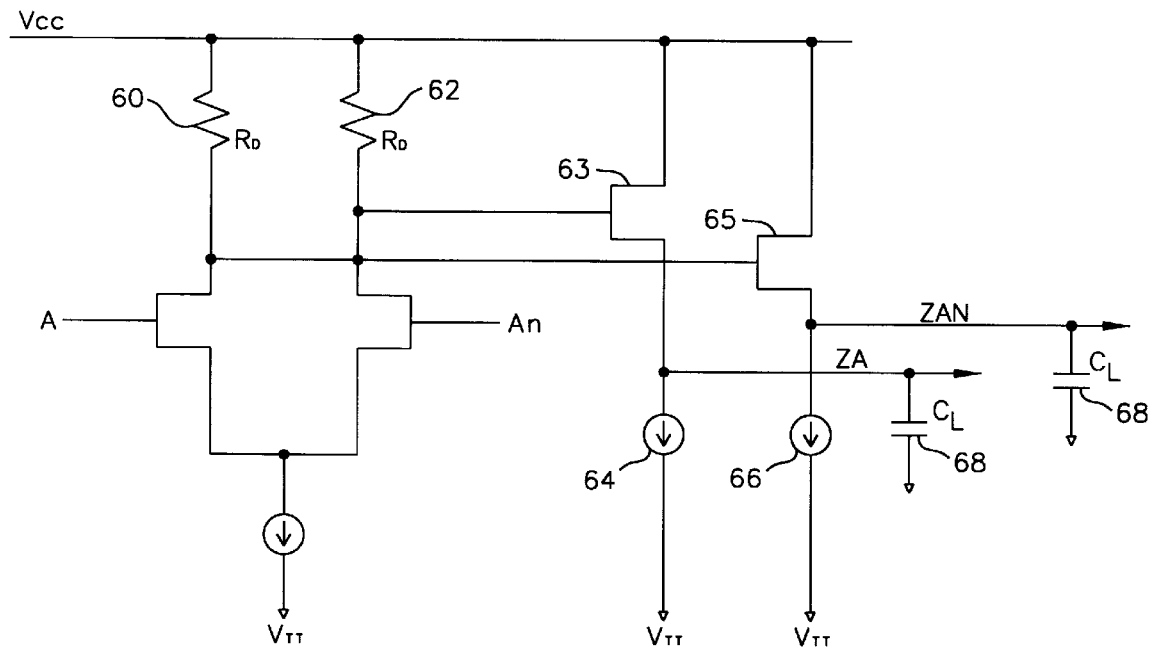
FIG. 6a illustrates a single gate SCFL delay cell of the present invention.

A detailed description of the preferred embodiment of the invention is now described with reference to FIGS. 6a, 6b and 7. FIG. 6a illustrates an SCFL delay cell of the present invention, which has been implemented in GaAs semiconductor technology using metal semiconductor field-effect transistors (MESFETs). The delay cell of FIG. 6a is similar to that of FIG. 5, except that p-channel devices 50 of FIG. 5 have been replaced with resistors 60 and 62 in FIG. 6a. This is because the method and apparatus of the present invention recognizes that the current generated by the differential input stage of the delay cell cannot be varied using the prior art techniques using p-channel devices. Thus, the present invention fixes the output current of the differential stage and instead varies the magnitude of the currents generated by current sources 64 and 66 in the source-follower output stage. The magnitude of these currents will dictate how quickly source follower devices 63 and 65 are able to drive the load impedances $C_L$ 68 presented by the differential input of the following stage of the VCO.

Figure 6B:
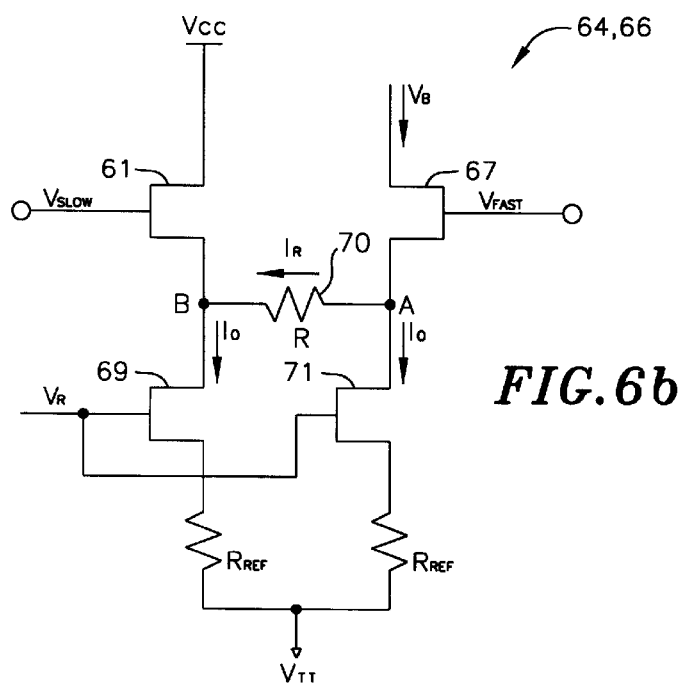

FIG. 6b illustrates a differential voltage-to-current converter cell which is designed to implement voltage-controlled current sources 64 and 66 of FIG. 6a. MESFETs 69 and 71 are the same size and are both coupled to the same reference voltage $V_R$. Thus, these devices act as current sources conducting an identical current $I_o$. Assuming that MESFETs 61 and 67 are relatively large devices, the voltage at node A will be approximately equal to $(V_{FAST}-V_t)$, where $V_t$ is the threshold of MESFET 67. Likewise, the voltage at node B will be approximately equal to $(V_{SLOW}-V_t)$. The voltage across resistor R 70 is therefore approximately equal to $(V_{FAST}-V_{SLOW})$. Thus, the current through resistor R 70 is approximately equal to $(V_{FAST}-V_{SLOW})/R$. In this way, the output current $I_B$ is linearly proportional to the differential value of the control voltage $(V_{FAST}-V_{SLOW})$. Output current $I_B$ is equal to $I_o+I_R$, which is approximately equal to $I_o+(V_{FAST}-V_{SLOW})/R$.

As the current $I_B$ in the output stage increases, the delay due to the loading of the next stage (i.e., $C_L$ 68) decreases. Because the delay of the cells is proportional to $(C_L/I_B)$, and because $I_B$ is linearly proportional to the differential control voltage $(V_{FAST}-V_{SLOW})$, the output frequency of a ring oscillator VCO built using this delay stage will be linearly proportional to the differential control voltage as well.

Figure 7:
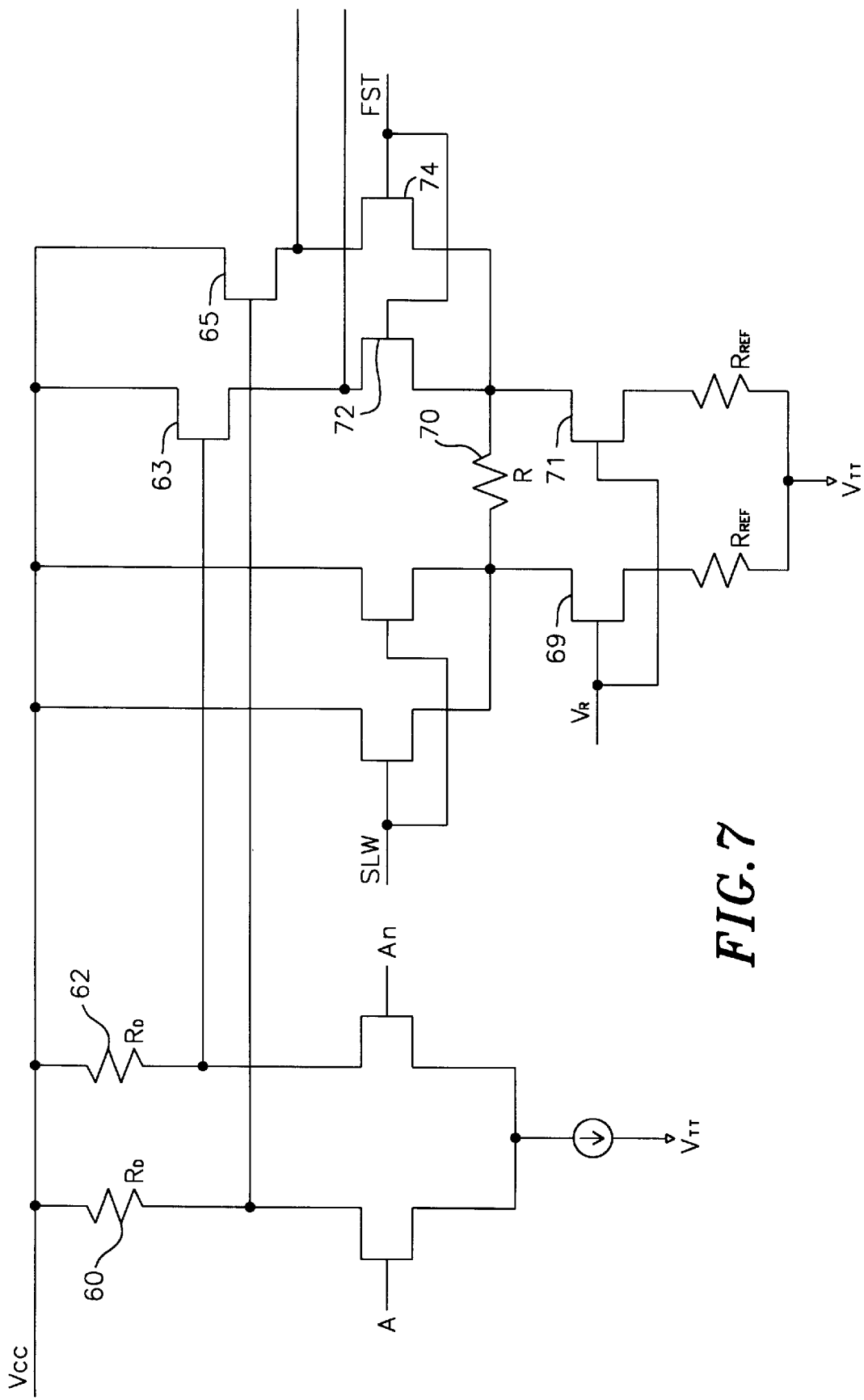

FIG. 7 illustrates a preferred embodiment of a delay cell to replace current sources 64 and 66 of FIG. 6a. By using two MESFETs (e.g. 72 and 74) in place of each of MESFETs 61 and 67, chip area can be saved because the voltage-to-current converter cell of FIG. 6b does not have to be duplicated in its entirety for each of the voltage-to-current converters 64 and 66 of FIG. 6a.

Figure 8:
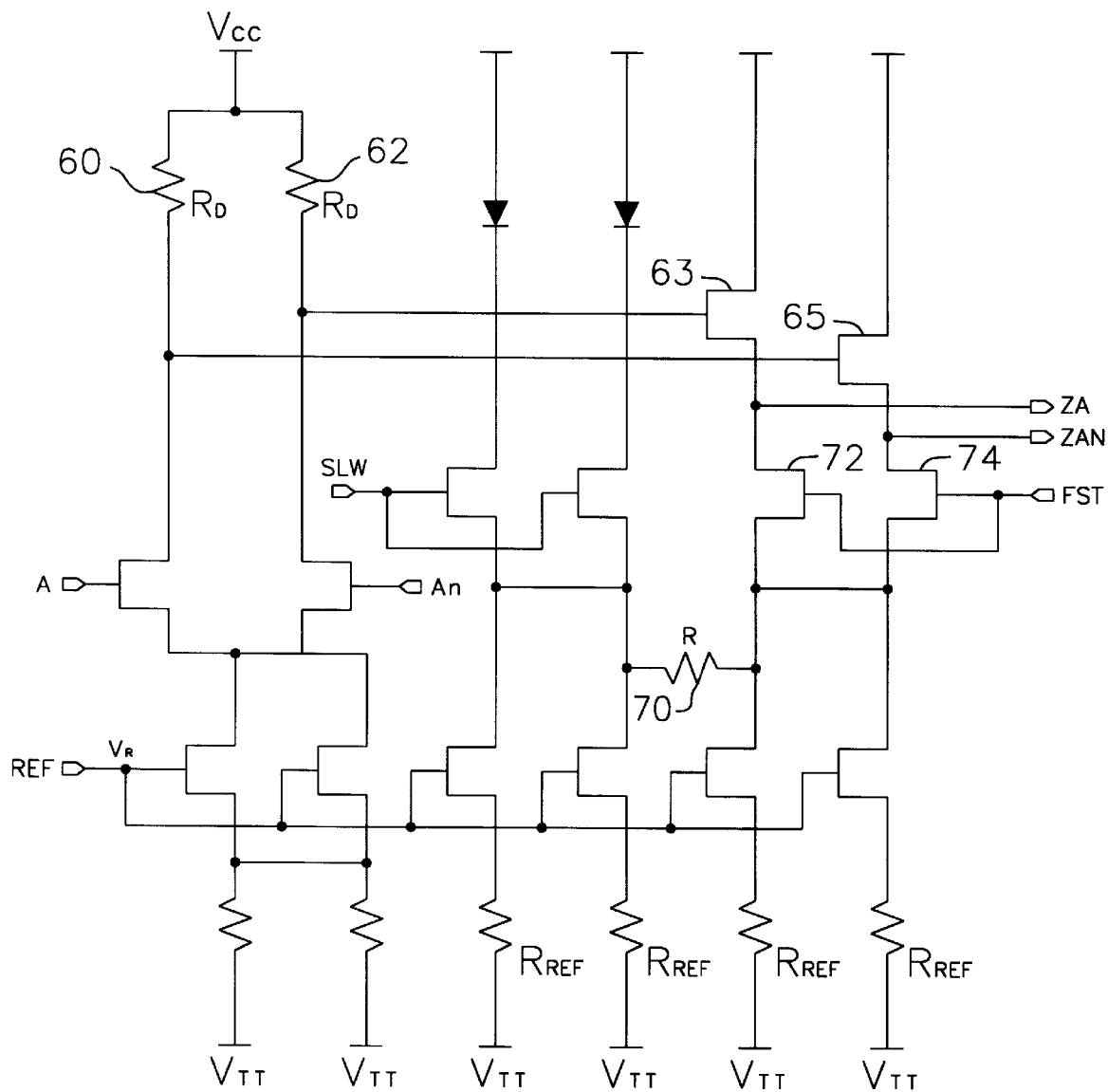
FIG. 8 illustrates a preferred embodiment of the delay cell of the present invention having been implemented in a four-stage VCO which in turn was implemented in a PLL.

FIG. 8 illustrates a preferred embodiment of a VCO delay cell implemented in GaAs technology, which was used in a four-stage VCO. This four-stage VCO was then integrated into a phase-locked loop which was capable of locking on to a reference clock over a frequency range of about 320 $MH_z$ to 1.1 $GH_z$.

Those of skill in the art will recognize that the description of the preferred embodiments of the invention disclosed in this application are exemplary only. There are numerous ways in which the details of the present invention can be implemented which do not depart from the scope of the invention as claimed. For example, the delay cell of the present invention could be applied to any circumstance for which a delay cell might be required in addition to the disclosed application of VCOs. Moreover, there are numerous ways of implementing the actual circuit designs to save die area or limit power consumption, and these details are intended to fall within the spirit and scope of the disclosed invention.

What is claimed is:

1. A method of controlling the response time of a delay cell, said delay cell comprising a differential input stage having a differential input and a differential output generating a differential output current, a differential source-follower output stage having a differential output current, a differential input coupled to the differential output of the differential input stage and a differential output coupled to a load, said method comprising the steps of:

fixing the differential output current of the differential input stage; and varying the differential output current of the source-follower output stage by varying a differential control signal coupled to at least one differential voltage-to-current converter of the delay cell.

2. A method for controlling the frequency of operation of a ring oscillator, the ring oscillator comprising a plurality of delay cells, each of the delay cells having a differential input stage which generates a differential output current and a source-follower output stage which has a differential output current, each of the delay cells coupled in series and in a ring configuration, said method comprising the steps of:

fixing the differential output current of the differential input stage of each of the delay cells; and varying the differential output current of the source-follower output stage for each of the delay cells by varying a differential control signal coupled to at least one differential voltage-to-current converter of each of the delay cells.

3. An apparatus for delaying a signal comprising:

a differential input stage having a differential input for coupling to said signal and having a fixed differential current and having a differential output; and a source-follower output stage further comprising;

two FET transistors in a source-follower configuration, each having a gate coupled to the differential output of the differential input stage; and two differential voltage-to-current converters each coupled to a source terminal of a respectively one of the two FET transistors to establish an output current magnitude, each of the voltage-to-current converters coupled to a differential control voltage.

4. The apparatus of claim 3 wherein the magnitude of the output current established by the differential voltage-to-current converters is proportional to the value of the differential control voltage.

5. The apparatus of claim 4 wherein response time of the source-follower output varies proportionally with the magnitude of the differential control voltage.

6. The apparatus of claim 3 wherein each of the voltage-to-current converters further comprises:

two reference MESFETs each configured as a current source to conduct an identical reference current through their respective drain terminals;

a resistor coupled between the two drain terminals;

a first MESFET transistor having a gate terminal coupled to a negative reference of the differential control voltage, a drain terminal coupled to a positive supply and a source terminal coupled to the drain of a first one of the reference MESFETs; and a second MESFET transistor having a gate terminal coupled to a positive reference of the differential control voltage, a drain terminal coupled to the source terminal of the respectively one of the two FET transistors and a source terminal coupled to the drain of a second one of the reference MESFETs.

7. A voltage controlled oscillator comprising:

a plurality of delay cells, each of said delay cells comprising a differential input stage and a source-follower output stage, each of said delay cells having its source-follower output stage coupled to the differential input of another of said delay cells in a ring configuration, and wherein:

the differential input stage has a differential input for coupling to a signal and has a fixed differential current and has a differential output; and the source-follower output stage further comprises:

two FET transistors in a source-follower configuration, each having a gate coupled to the differential output of the differential input stage; and two differential voltage-to-current converters each coupled to a source terminal of a respective one of the two FET transistors to establish an output current magnitude, each of the voltage-to-current converters coupled to a differential control voltage.

8. The voltage controlled oscillator of claim 7 wherein said oscillator is capable of oscillating over a range of frequency values and wherein the differential control voltage determines a frequency value within the range.

9. The voltage controlled oscillator of claim 7 wherein the magnitude of the output current established by the differential voltage-to-current converters is proportional to the value of the differential control voltage.

10. The voltage controlled oscillator of claim 9, wherein response time of the source-follower output varies proportionally with the magnitude of the differential control voltage.

11. The voltage controlled oscillator of claim 7 wherein each of the voltage-to-current converters comprises:

two reference MESFETs each configured as a current source to conduct an identical reference current through their respective drain terminals;

a resistor coupled between the two drain terminals;

a first MESFET transistor having a gate terminal coupled to a negative reference of the differential control voltage, a drain terminal coupled to a positive supply and a source terminal coupled to the drain of a first one of the reference MESFETs; and a second MESFET transistor having a gate terminal coupled to a positive reference of the differential control voltage, a drain terminal coupled to the source terminal of the respective one of the two FET transistors and a source terminal coupled to the drain of a second one of the reference MESFETs.

12. A method for controlling the frequency of operation of a ring oscillator, the ring oscillator comprising a plurality of delay cells, each of the delay cells having a differential input stage which generates a differential output current and a source-follower output stage which has an output current, each of the delay cells coupled in series and in a ring configuration, said method comprising the steps of:

fixing the differential output current of each of the delay cells; and varying the output current for each of the delay cells using the same control signal by varying a differential control voltage coupled to at least one voltage-to-current converter of each of the delay cells.

* * * * *